United States Patent [19]

Zehner

[11] Patent Number: 4,538,243

[45] Date of Patent: Aug. 27, 1985

[54] ASSOCIATIVE MEMORY WITH IMPROVED MEMORY CELL AND METHOD FOR OPERATING SAME

[75] Inventor: Bernd Zehner, Holzkirchen, Fed. Rep. of Germany

[73] Assignee: Siemens Aktiengesellschaft, Berlin & Munich, Fed. Rep. of Germany

[21] Appl. No.: 418,526

[22] Filed: Sep. 15, 1982

[30] Foreign Application Priority Data

Sep. 30, 1981 [DE] Fed. Rep. of Germany ....... 3138993

[51] Int. Cl.$^3$ .............................................. G11C 11/40
[52] U.S. Cl. ...................................... 365/49; 365/154
[58] Field of Search .................. 365/49, 154, 190, 202

[56] References Cited

U.S. PATENT DOCUMENTS 3,633,182  1/1972  Koo ...................................... 365/49

*Primary Examiner*—Joseph A. Popek

*Attorney, Agent, or Firm*—Hill, Van Santen, Steadman & Simpson

[57] ABSTRACT

An improved memory cell for use in an associative memory has a RAM cell having two output terminals respectively connected to a bit line and a complementary bit line through transistors having respective control electrodes connected to a word line. The outputs of the RAM cell are also cross-connected to the control electrodes of further transistors respectively connected to the bit lines and having a common terminal connected to the controlled electrode of a transistor which determines the state of a hit line. When the word line is activated, information occurring on the bit line is written into the RAM cell. If the word line is non-activated, information supplied by the bit line is compared to information currently stored in the RAM cell and the result of the comparison is utilized to determine the state of the hit line.

4 Claims, 1 Drawing Figure

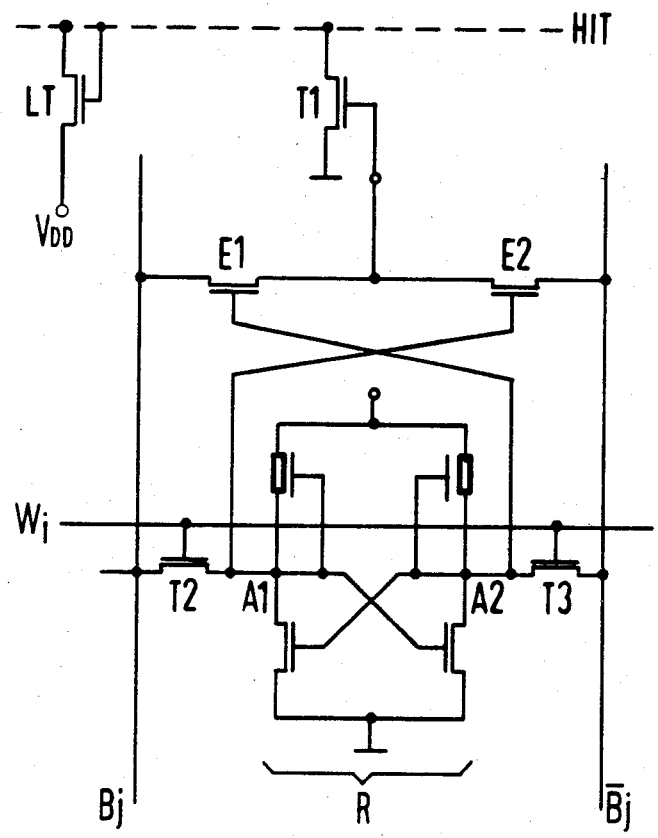

ASSOCIATIVE MEMORY WITH IMPROVED MEMORY CELL AND METHOD FOR OPERATING SAME

BACKGROUND OF THE INVENTION

The present invention relates to associative memories and methods for operating same, and in particular to a memory cell for use in an associative memory and a method for operating the memory cell.

Increasingly fast memories with correspondingly fast memory cells are required for VLSI microcomputers. An associative memory, such as a content addressable memory (CAM) is commonly utilized in such devices. Such a memory includes a plurality of random access memory (RAM) cells in which information can be written, the information later being compared to subsequent input information. The result of the comparisons is represented by an electronic signal which is utilized for further data processing purposes.

Conventional content addressable memories utilize RAM cells for storing information, the RAM cells in such known memories being connected to relatively complex comparison circuits for the purpose of comparing the stored information to subsequently-received information. Known memory cells which are suitable for use as memory cells in an associate memory thus exhibit many transistor stages and are thus characterized by long delay times in the execution of the necessary memory operations. In view of the relatively large number of components necessary in and with such conventional memory cells, these memory cells require a large amount of wiring or conductor runs in order to be properly connected for use in associative memories.

It is accordingly an object of the present invention to provide a memory cell suitable for use in an associative memory such as a content addressable memory having small delay times by employing only a small number of transistor stages.

Another object of the present invention is to provide an improved memory cell which requires significantly fewer connections and less wiring and/or conductor runs as a result of the employment of a small number of transistor stages.

The above objects are inventively achieved in an improved memory cell which includes a RAM memory cell which is connected to a bit line and a complementary bit line through transistors which have control electrodes connected to a word line. Each output of the RAM cell is also cross-connected to the control electrodes of additional transistors which are connected to the bit lines and which have a common terminal connected to the control electrode of a transistor which determines the state of a hit line. When the word line is activated, the information supplied by the bit line is written into the RAM cell. Information supplied by the bit line when the word line is non-activated is compared with the information currently stored in the RAM cell and the result of the comparison is supplied to the control electrode of the transistor which is utilized to determine the state of the hit line for updating the status of the hit line.

The improved memory cell disclosed and claimed herein, because of the small number of transistors necessary to operate the cell in combination with the various lines associated with the memory, exhibits significantly decreased delay times in comparison with conventional memory cells and further requires a significantly less number of connections for operation.

Only two delay times occur in the memory cell disclosed and claimed herein between the time that information to be compared to the memory content is supplied to the memory cell and the time of transfer of the result of the comparison to the hit line, because only two transistor stages are addressed during execution of this operation.

BRIEF DESCRIPTION OF THE DRAWING

The single FIGURE is a circuit diagram for an improved memory cell constructed in accordance with the principles of the present invention.

DESCRIPTION OF THE PREFERRED EMBODIMENTS

An improved memory cell is shown in the drawing for use in a memory having a word line $W_i$, a bit line $B_j$ and a complementary bit line $\bar{B}_j$ associated therewith. The signal on the complementary bit line $\bar{B}_j$ is the complement or inversion of the signal on the bit line $B_j$. The improved memory cell includes a RAM cell R having two terminals A1 and A2. The terminal A1 is connected to the bit line $B_j$ through a transistor T2 and the terminal A2 is connected to the complementary bit line $\bar{B}_j$ through a transistor T3. Each of the transistors T2 and T3 has a control (gate) electrode connected to the word line $W_i$.

The improved memory cell further includes transistors E1 and E2 respectively connected to the bit line $B_j$ and the complementary bit line $\bar{B}_j$ and having a common terminal. The control (gate) electrodes of the transistors E1 and E2 are cross-connected to the output terminals of the RAM cell R such that the terminal A1 is connected to the control electrode for the transistor E2 and the terminal A2 is connected to the control electrode for the transistor E1.

The common electrode of the transistors E1 and E2 is connected to the control (gate) electrode of a transistor T1 which is connected to a hit line HIT, and functions to determine the status of the hit line HIT by changing the state thereof in dependence upon whether the transistor T1 is in a conducting or non-conducting state as a result of the signal supplied to its control electrode.

Given an activated word line $W_i$, input information which is supplied via the bit line $B_j$ is written into the RAM cell R. Given a non-activated word line $W_i$, input information supplied by the bit line $B_j$ is compared with the current information stored in the RAM cell R. The result of a comparison is forwarded as a signal to the control electrode of the transistor T1 which determines the status of the hit line depending upon the result of the comparison. If the result of the comparison indicates that the information supplied by the bit line $B_j$ coincides with the current content of the RAM cell R, the normal high signal occurring on the hit line HIT is not changed. If the result of the comparison indicates that the information supplied by the bit line $B_j$ does not agree with the current content of the RAM cell R, the normally high signal of the hit line HIT is not enabled and the hit line HIT is pulled low as a result of the transistor T1 being switched to a conducting state.

An associative memory constructed with a plurality of improved memory cells of the type disclosed herein may be constructed with the improved memory cells disposed in a matrix of i rows and j columns. Thus, i words $M_i$ respectively having j bits $n_{ij}$ per word can be stored in the i rows. Such an associative memory exhibits a regular structure and accordingly has a very low wiring outlay. These two properties are extremely important in VLSI circuits in order to manufacture and operate fast VLSI circuits in an economic manner.

The improved memory cell disclosed herein enables an economic realization of a fast associative memory. No additional wiring is required for a particular row i of improved memory cells. The transistor T1 of the improved memory cell forms a portion of a NOR gate which services the entire line i. A word $M_k$ to be compared with the current contents of the various memory cells in a row is compared in parallel via the bit lines $B_j$ and $\bar{B}_j$ to the words $M_i$ stored in the associative memory. When a specific word $M_k$ is stored in a specific row of the associative memory, the hit line HIT associated with that row remains activated. When it is guaranteed by the loading program for the associative memory that a specific word can be stored at most once in the associative memory, the improved associative memory achieves, in a simple manner, a means for indicating that the specific word is stored in a row to be provided. For example, all hit lines HIT for all the rows in an associative memory may be linked to one another by means of a further NOR gate.

The improved memory cell also permits construction of an associative memory with optimum space utilization, thereby significantly reducing the total area required for the memory. The improved memory cell exhibits the functions of both a RAM cell and an exclusive OR gate.

One load transistor LT is connected for each row i of an associative memory comprised of improved memory cells, the load transistors each having a current path (source-drain in the embodiment shown in the drawing) connected between the supply voltage $V_{DD}$ and the hit line HIT and a control electrode (gate) also connected to the hit line HIT. EAch load transistor LT forms a NOR gate in combination with the transistors T1 of each cell in a row.

Although modifications and changes may be suggested by those skilled in the art it is the intention of the inventor to embody within the patent warranted hereon all changes and modifications as reasonably and properly come within the scope of his contribution to the art.

I claim as my invention:

1. An associative memory having a plurality of memory cells arranged in i rows, each row having j cells for use with i word lines respectively for said rows, j bit lines and j complementary bit lines respectively for each of said cells, and at least one hit line, each said memory cell comprising:

a random access memory cell having first and second output terminals;

a pair of first transistors each having a control electrode connected to the word line for the row in which said cell is located and one of said first transistors being interconnected between said first terminal of said random access memory cell and the bit line for said cell and the other of said first transistors being interconnected between said second terminal of said random access memory cell and the complementary bit line for said cell;

a pair of second transistors having a common terminal, one of said second transistors having a control electrode connected to said first terminal of said random access memory cell and being connected to said complementary bit line for said cell and the other of said second transistors having a control electrode connected to said second terminal of said random access memory cell and being connected to said bit line for said cell;

a third transistor connected to said hit line and having a control electrode connected to said common terminal of said second transistors, and said associative memory further having i load transistors each having a current path connected between a supply voltage and said hit line and a control electrode for said current path also connected to said hit line, each said load transistor forming a NOR gate in combination with said third transistors of each said cell in a row whereby information on said bit line is written into said random access memory cell when said word line activated and information on said bit line is compared with information stored in said random access memory cell when said word line is non-activated and the result of said comparison is utilized for controlling said third transistor for enabling of inhibiting said hit line.

2. The associative memory of claim 1 wherein i words are consisting of j bits are stored in each of said rows.

3. The associative memory of claim 1 further comprising a means for indicating that a specific word is stored in a row.

4. A method for operating an associative memory having a plurality of RAM cells disposed in rows and columns, each cell having output terminals respectively connected through transistors, which are controlled by a word line for the row containing the cell, to a bit line and a complementary bit line and which terminals are further cross-connected to control electrodes of additional transistors connected to said bit line and said complementary bit line and having a common terminal connected to the control electrode of a transistor for determining the status of a hit line, comprising the steps of:

writing information into one of said RAM cells from said bit line only when the word line for the row containing the cell is activated;

comparing a specific word on said bit line in parallel with all words stored in all of said RAM cells in the row connected to the activated word line after activation thereof; and setting the status of said hit line in dependence upon the results of said comparison by switching said transistor for determining the status of said hit line.

* * * * *